(12) United States Patent
Tsironis (10) Patent No.: US 11,460,530 B1
(45) Date of Patent: Oct. 4, 2022

(54) SLIDE SCREW TUNER WITH ADJUSTABLE PITCH

(71) Applicant: Christos Tsironis, Dollard-des-Ormeaux (CA)

(72) Inventor: Christos Tsironis, Kirkland (CA)

( * ) Notice: Subject to any disclaimer, the term of this patent is extended or adjusted under 35 U.S.C. 154(b) by 33 days.

(21) Appl. No.: 16/993,688

(22) Filed: Aug. 14, 2020

(51) Int. Cl.
*G01R 35/00* (2006.01)
*H01C 10/40* (2006.01)

(52) U.S. Cl.
CPC ........... *G01R 35/005* (2013.01); *H01C 10/40* (2013.01)

(58) Field of Classification Search
CPC ...... G01R 35/005; G01R 27/00; G01R 25/00; G01R 29/00; G01R 31/00; G01R 35/00; G01R 17/105; H01C 10/40; G01D 7/00; G01D 21/00; G01D 9/00; G06F 11/00; G06F 11/03; G06F 19/00; G06F 15/00; H03J 5/10; H03J 5/143; H02J 50/20; H05H 1/0062; G01L 1/25; G05B 2219/40578; G05B 2219/21123; G01N 27/02; G01H 15/00; H01R 13/6473
See application file for complete search history.

(56) References Cited

U.S. PATENT DOCUMENTS

| | | | | |
|---|---|---|---|---|
| 7,102,457 B1* | 9/2006 | Tsironis | ............. | G01R 31/2831 324/613 |
| 8,975,988 B1* | 3/2015 | Tsironis | .................... | H01P 5/04 333/263 |
| 9,148,127 B1* | 9/2015 | Lee | ............................ | H01P 5/04 |
| 9,257,963 B1* | 2/2016 | Tsironis | .................... | H01P 5/04 |
| 9,625,556 B1 | 4/2017 | Tsironis | | |
| 9,716,303 B1* | 7/2017 | Tsironis | .................... | H01P 5/04 |
| 2006/0017530 A1* | 1/2006 | Boulerne | ........... | G01R 31/2822 333/263 |
| 2019/0086503 A1* | 3/2019 | Simpson | .............. | G01R 35/005 |

OTHER PUBLICATIONS

M. Pierpoint, R. D. Pollard and J. R. Richardson, "The Design and Modelling of Automated Broadband Slide-Screw Tuners," 29th ARFTG Conference Digest, 1987, pp. 218-228, doi: 10.1109/ARFTG. 1987.323867. (Year: 1987).*
"Computer Controlled Microwave Tuner, CCMT", Product Note 41, Focus Microwaves Inc. 1998.
Stepper motors [online], Wikipedia [retrieved on Jul. 3, 2020]. Retrieved from Internet <URL: https://en.wikipedia.org/wiki/Stepper_motor>.
Linear actuator [online], Wikipedia [retrieved on Apr. 25, 2020] Retrieved from Internet <URL: https://en.wikipedia.org/wiki/Linear_actuator>.

* cited by examiner

*Primary Examiner* — Daniel R Miller
*Assistant Examiner* — Eric Sebastian Von Wald (57) ABSTRACT

A slide screw tuner control mechanism uses linear actuator movement with numerically controlled PITCH (number of threads per inch). The PITCH is adjustable using the concept of a differential screw, implemented by independent control of the rotation of the actuator built-in ACME screw, yielding a numerically controllable overall effective PITCH. Tuner calibration and tuning can use dynamically adjustable horizontal movement increments increasing tuning speed at low frequencies without loss of fine-tuning resolution at high frequencies.

4 Claims, 9 Drawing Sheets

SLIDE SCREW TUNER WITH ADJUSTABLE PITCH

PRIORITY CLAIM

Not Applicable

CROSS-REFERENCE TO RELATED ARTICLES

1. "Computer Controlled Microwave Tuner-CCMT", Product Note 41, Focus Microwaves Inc., January 1998.
2. Stepper motors [online], Wikipedia [retrieved on Jul. 3, 2020]. Retrieved from Internet <URL: https://en.wikipedia.org/wiki/Stepper_motor>.
3. Tsironis C, U.S. Pat. No. 9,625,556, "Method for calibration and tuning with impedance tuners".
4. Linear actuator [online], Wikipedia [retrieved on Apr. 25, 2020]. Retrieved from Internet <URL: https://en.wikipedia.org/wiki/Linear_actuator>.

BACKGROUND OF THE INVENTION

Modern design of high-power microwave amplifiers and oscillators, used in various telecommunication systems, requires accurate knowledge of the active device's (microwave transistor's) characteristics. Source and Load pull are measurement techniques for this characterization employing microwave impedance tuners and other microwave test equipment. The microwave tuners are used in order to manipulate the microwave impedance conditions under which the Device Under Test (DUT, or transistor) is tested. This invention relates to the remote movement control of such a slide screw impedance tuner.

Figure 1:
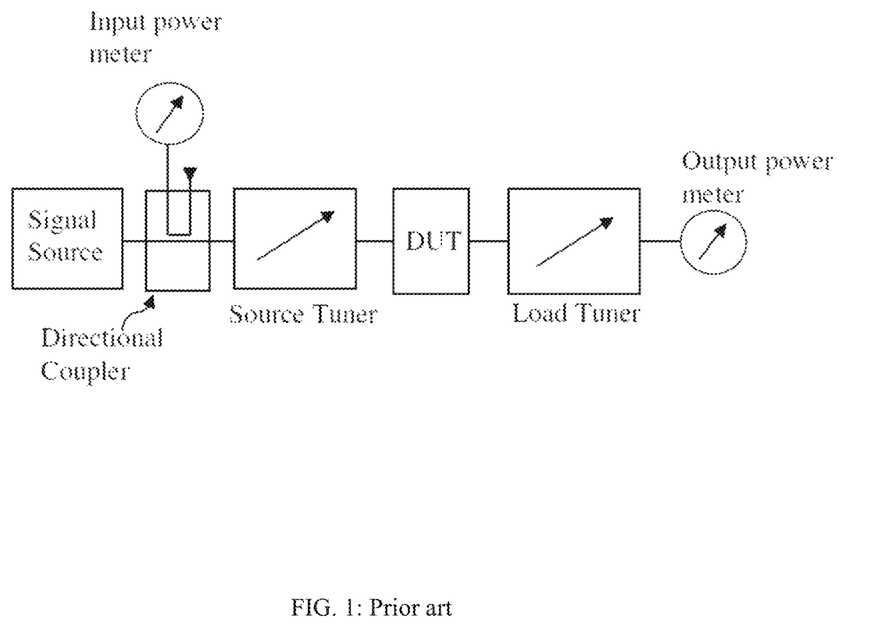
FIG. 1 depicts prior art, a block diagram of a load pull measurement setup, in which electro-mechanical impedance tuners are used to manipulate the source and load impedances presented to the DUT.

A typical load pull measurement system is shown in FIG. 1. The tuners and the overall test system are controlled by a control computer (not shown), which is connected to the tuners and the test equipment using control cables. Electro-mechanical slide screw tuners (see ref. 1, FIG. 2) use adjustable metallic mechanical obstacles (RF tuning probes or slugs) inside the transmission media of the tuners to reflect part of the power coming out of the DUT (device under test) and create this way adjustable microwave impedances presented to the DUT in order to perform the corresponding tests. The transmission media of the tuners are made using a low loss slotted coaxial airline or parallel plate airline (slabline), which has a, typically cylindrical, center conductor, a test port and an idle port. The tuners are built into a solid, torque resistant, housing (box), FIG. 2, and include: At least one mobile carriage which slides horizontally along the slabline (X) and holds the RF tuning probe; both carriage and tuning probe are controlled by electrical stepper motors (see ref. 2) ensuring the horizontal and vertical movement of the carriage (X) and the probe (Y). The probe is attached to a precision vertical axis controlled by a vertical stepper motor; the ACME lead screw, engages the mobile carriage and is responsible for its horizontal movement and is controlled by a second (horizontal) stepper motor using a transmission gear, like a set of pulleys and a timing belt drive (FIG. 3), which form a gear system, the translation ratio of which (the ratio of the pulley diameters) can be configured at the factory. The decisive characteristic of the ACME screw is its PITCH (the number of Threads Per Inch), corresponding to the required number of screw rotations to move the carriage by 1 inch.

BRIEF SUMMARY OF THE INVENTION

Figure 2:
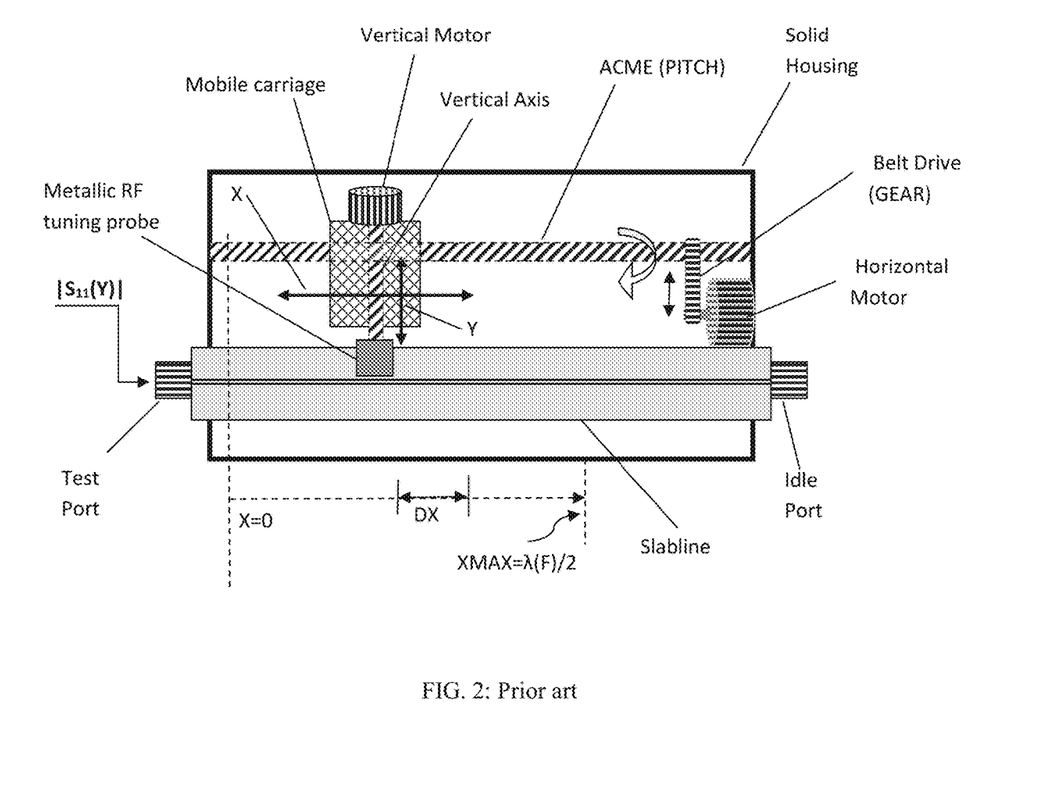
FIG. 2 depicts prior art, a front view of a slide screw tuner and associated components and definitions.
Figure 3:
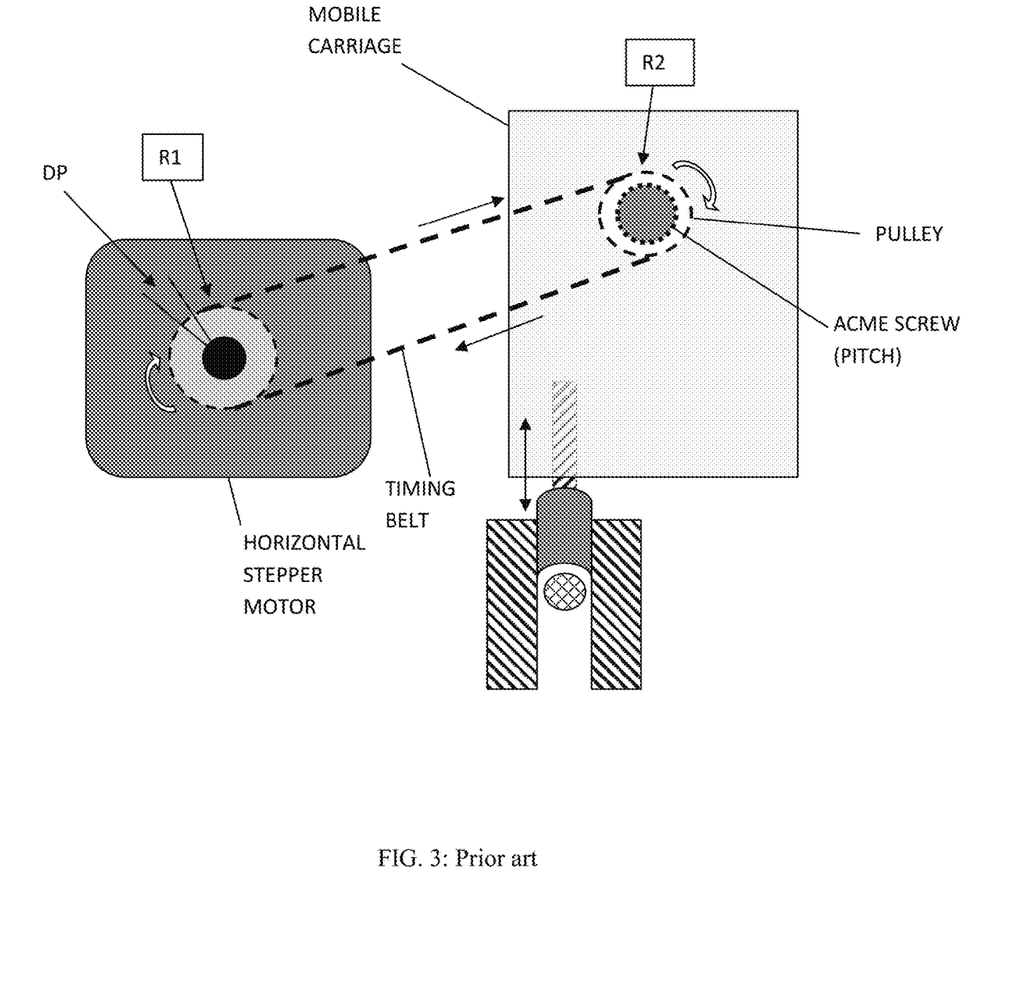
FIG. 3 depicts prior art, the horizontal position control of the mobile carriage using a set of pulleys, a timing belt drive and a stepper motor controlling the ACME screw moving the carriage.

Control of the reflection factor phase $\Phi 11$ created by the tuner is through horizontal movement of the carriage (see ref. 1). In order to cover a 360 degr circle of the reflection factor on the Smith Chart, the free horizontal travel of the mobile carriage must be one half of a wavelength at the frequency of operation; for example, at 1 GHz the free travel must be 15 cm, at 0.5 GHz 30 cm etc. A full load pull characterization of transistors in this and even lower frequencies requires the tuner mobile carriage to move horizontally over distances of this and higher orders of magnitude (up to 1.5 meters at 100 MHz). The stepper motors typically used in this kind of equipment have a standard intrinsic step size of 1.8 degr/step corresponding to 200 steps per revolution. For a given ratio of pulleys R1 and R2 (FIG. 3) and ACME screw PITCH (threads per inch) every motor step corresponds to an increment in horizontal carriage (and probe) position (FIG. 2).

Figure 4:
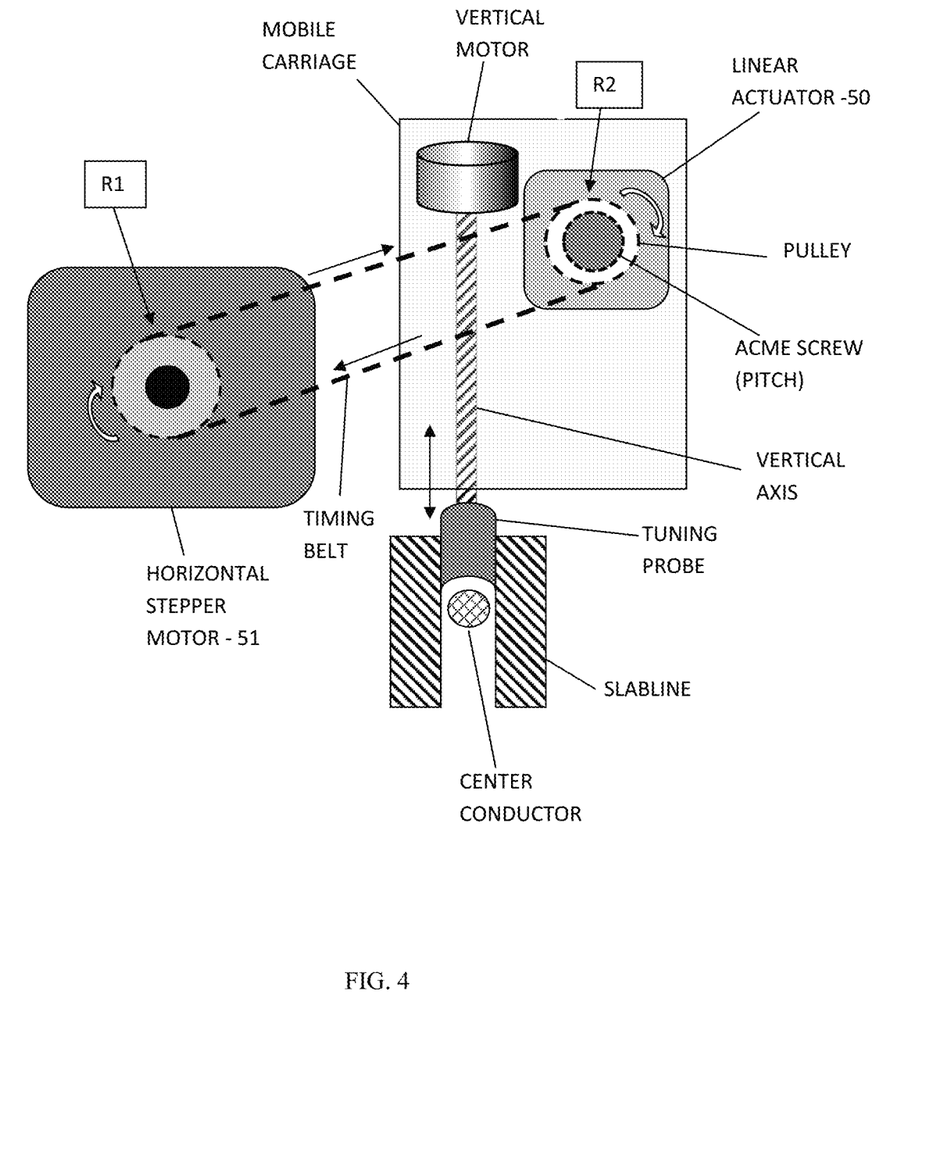
FIG. 4 depicts the horizontal position control of the mobile carriage using a linear actuator and a differential ACME rotation control using a stepper motor, a set of pulleys and a timing belt drive.
Figure 5:
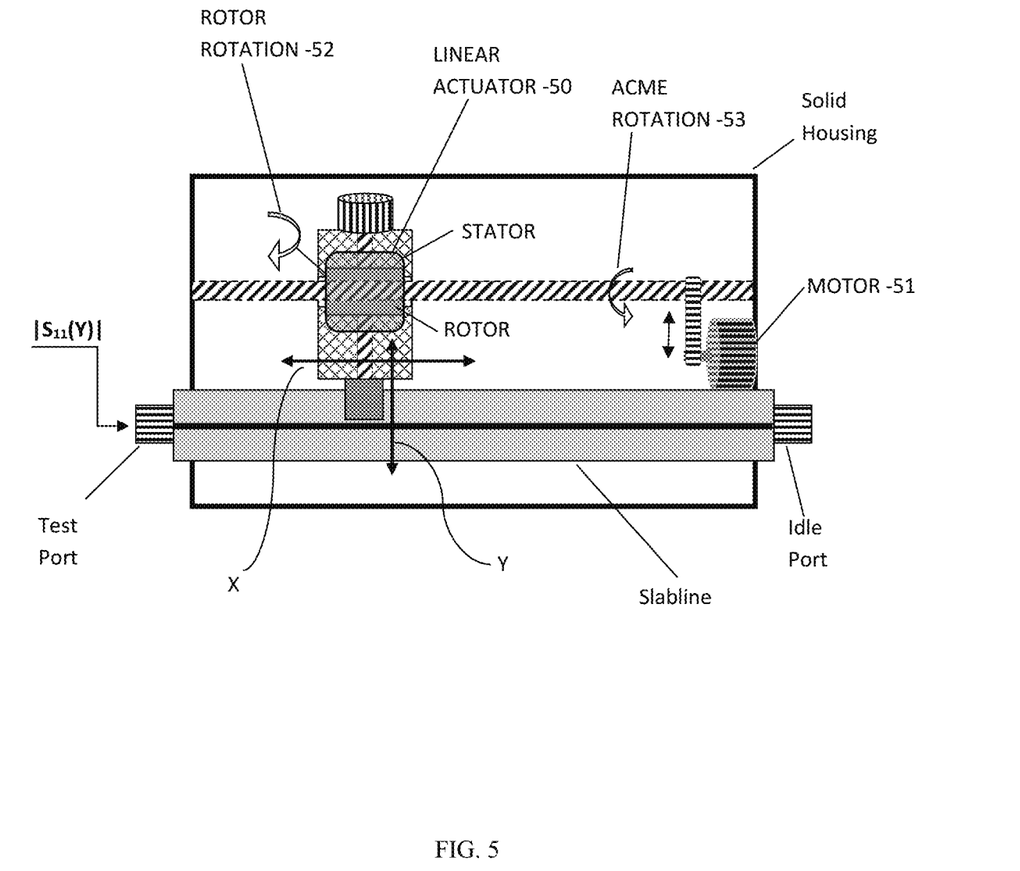
FIG. 5 depicts a slide screw tuner with adjustable horizontal PITCH drive.

The horizontal step increment (FIG. 3, 4) is DX=DP*R1/(R2*PITCH), wherein DP is the stepper motor step angle (1.8 degr), R1 is the radius of the motor pulley, R2 is the radius of the pulley controlling the ACME screw and PITCH the per inch number of threads of the ACME screw. When PITCH increases the movement gets finer or the steps DX become smaller. The quantities DP, R1 and R2 are structurally given and cannot be modified without modifying the machine or changing the motor, and so has been so far the case also for the PITCH of the ACME screw; I claim that the item that can be modified in situ is the effective PITCH of the ACME, when used for horizontal carriage control of a slide screw tuner. This cannot be changed physically without modifying the machine either, but it can be changed operationally. This invention discloses a tuner structure wherein the effective PITCH of the ACME can be adjusted by control software; it includes the capacity to add independent rotation 53 to the ACME screw of the linear actuator 50 (ref. 4) to the actuator rotor rotation 52, which controls the carriage position (FIGS. 4 and 5).

BRIEF DESCRIPTION OF THE DRAWINGS

The invention and its mode of operation will be better understood from the following detailed description when read with the appended drawings in which:

FIGS. 9A through 9B depict calibration point density: FIG. 9A depicts minimum frequency; FIG. 9B depicts maximum frequency.

DETAILED DESCRIPTION OF THE INVENTION

The concept of a numerically controlled PITCH (in units THREADS/INCH) of a linear actuator movement is new. In the case of impedance slide screw tuners, it allows standardization of equipment operating effectively over much larger frequency ranges than before. In hitherto technology the built-in ACME PITCH in combination with the selected pulleys R1 and R2 (FIG. 3) determines the horizontal increment movement (see equation above), or the minimum distinct phase step of the reflection factor defining the equivalent tuning resolution. Tuning in-between increments is impossible.

At high frequencies the increment must small and remains the same at low frequencies; but in this case the movement at low frequencies (i.e. over longer distances) lasts longer. Tuners covering one decade of frequency range (Fmax: Fmin=10:1) will be either too slow at Fmin or too coarse at Fmax. A fine phase increment of 1 degr at 1.8 GHz will create a coarse phase increment of 10 degr at 18 GHz, which is unacceptable. This is a typical situation with commercially available equipment today.

Figure 6:
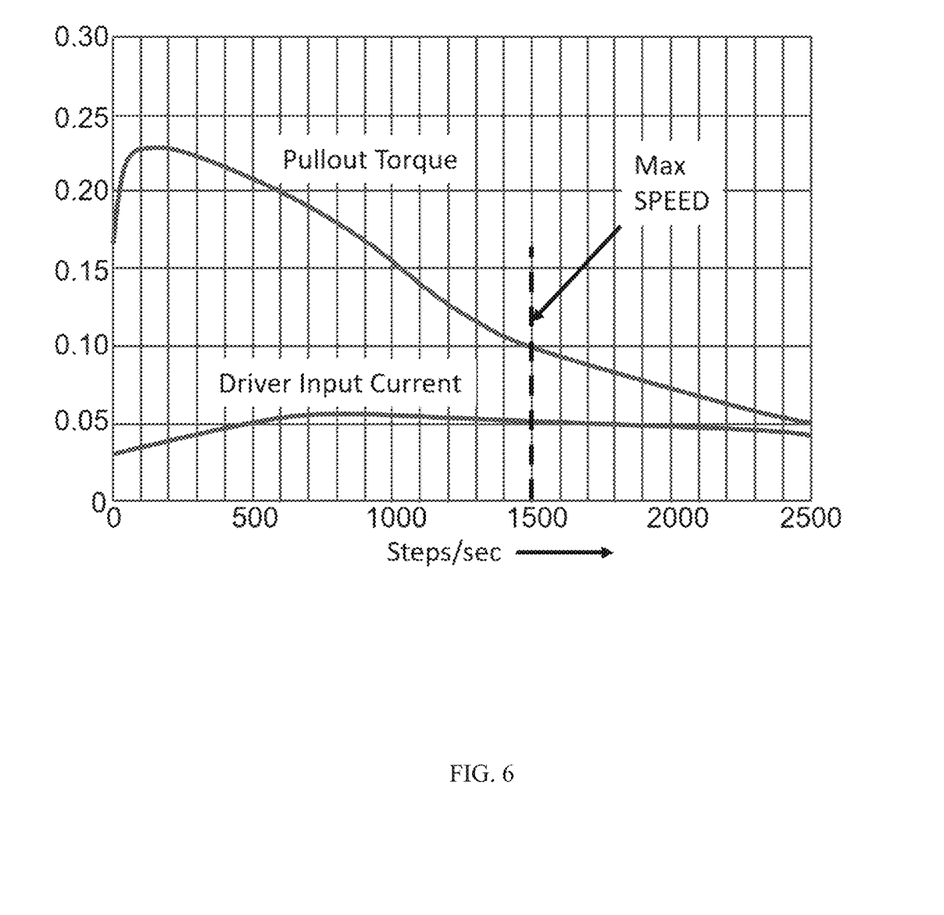
FIG. 6 depicts prior art, torque versus rotation speed of stepper motor, showing maximum step/second rotation speed (1500 steps/sec corresponds to 7.5 turns per second or ≈16 mm/sec at a PITCH of 12 and a pulley ratio R2/R1=1).

The same happens with tuning (carriage movement) speed. The stepper motors have an internal speed limitation because of coil self-resonance (FIG. 6). At a maximum speed, dictated by the available and required torque, a tuner with high tuning resolution of 1 degr at 18 GHz will be 10 times slower at 1.8 GHz, because the associated phase increment will be 0.1 degr, or to travel over a certain phase distance will require 10 times more steps, which, at constant rotation speed, corresponds to 10 times longer.

The solution to this impasse is either designing a pulley gear (R2/R1) with a medium resolution, in which case at low frequencies the tuner is not too slow and at high frequencies not too coarse, or introduce a variable ACME PITCH. This, of course cannot be done in situ chirurgically, i.e. by modifying the ACME screw. It can be only by controlling the mobile carriage using a linear actuator 50. In this case changing the effective PITCH can be done using the concept of the differential screw (FIG. 5). The rotor of actuator 50 rotates in one direction 52 moving the carriage using the ACME built-in PITCH, but then the independent external horizontal motor 51 rotates the ACME itself in the same or opposite direction. In this case the effective PITCH is the sum or the difference of the individual PITCH. Notice: PITCH ads inverse, like parallel resistances: 1/TOTAL PITCH=1/PITCH.A+1/PITCH.B; For instance, and assuming that both motors have the same phase step of 1.8 degr, the ACME PITCH=12 (threads/inch) corresponds to a linear movement of 10.6 µm per motor step of 1.8 degr. Using a pulley ratio R2/R1=2 leads to 5.3 µm per motor step in the configuration of FIG. 3. In the configuration of FIG. 5, if the actuator motor 50 moves one step (10.6 µm) and the external motor 51 moves one counter-step (5.3 µm), this will result in half the horizontal increment, corresponding to an effective PITCH of 24 (steps/inch): 1/12−1/24=1/24, or a twice as high resolution (and slower) per actuator motor 50 step; on the other hand, if motor 51 rotates in the same direction as motor 50, then, the effective PITCH will be 8, because (1/8=1/12+1/24) or 50% coarser (and faster), yielding 15.9 µm linear movement per motor step.

This counter-turning can already double the effective tuning resolution. But the method goes further: Since motors 50 and 51 operate independently, it remains a free choice not to limit the movement control to a "step-for-step" situation. One step of motor 50 can be countered by several steps of motor 51. In this case, by selecting a pulley ratio R2/R1 of 4:1 or 8:1 the ACME rotation by motor 51 leads to the equivalent of 1/4 or 1/8 of motor 50 rotation generating an even higher tuning resolution. The built-in ACME PITCH of 12 (threads/inch) comes down to an unmodified horizontal increment per motor step of 10.6 µm/step, or a phase increment of 0.44 degr/step at 18 GHz and 0.044 degr/step at 1.8 GHz; a full circle on the Smith chart includes 8,182 steps at 1.8 GHz and 818 steps at 18 GHz. At a maximum rotation speed of 1500 steps/sec (FIG. 6) at 1.8 GHz a full rotation would last 5.45 seconds (for an unnecessary high resolution of 0.044 degr/step), and at 18 GHz it would last a fast 0.55 sec with a too coarse resolution of 0.44 degr/step. Tuning resolution should be better than 0.1 degr/step at any frequency. Obviously, being able to trade off speed versus resolution is a benefit, which the new structure brings, by allowing to adjust the effective PITCH from 48 (threads/inch) when using a pulley ratio R2/R1=4 and rotating opposite to motor 50, to fractions of 12 when rotating in the same direction, assuming that motor 51 executes proportionally more steps than motor 50, i.e. the movement is not synchronized. This, though, is irrelevant because the tuning interpolation routine uses always the fine step XF number and determines the actual required probe position to tune to a specific impedance with high precision and resolution and the motor steps are then calculated and executed independently (see ref. 3, column 5, lines 62-63).

The method is also capable of combining high (coarse) tuning speed with fine final tuning. As an example, using the previously discussed pulley ratio R2/R1=4:1, if the target position, calculated using a high resolution fine step XF, is 2545 steps away from the actual probe position, then the ACME is first kept fixed (motor 51 does not move) and the actuator executes the integer of 2545/4=636.25, i.e. 636 coarse steps XC in short time, corresponding to 2544 fine steps XF. Then the second motor 51 executes one more step in the same direction to reach 2545 fine steps. The total time is roughly 4 times less, with the same fine-tuning resolution. The same is valid if the integer is higher than the final number; in this case motor 51 rotates opposite; example 2551=638 motor 50 coarse steps XC and 1 motor 51 fine step XF reverse.

Calibrating the tuner creates a certain dilemma. The tuner could be calibrated at the highest resolution, i.e. move a number of fine steps until the next coarse step position is reached, then reverse all fine steps, move one coarse step and re-start adding fine steps until the next coarse step is reached etc. The procedure can be accelerated by either bypassing the fine step round or adding-on some fine steps to divide the phase jump to meaningful size. This can be controlled as a function of frequency and calibration area on the Smith chart. The reflection factor phase is a linear function of distance $\Phi 11(degr)=-4*180*X/\lambda$; this means that a linear interpolation between X increments will be accurate enough. But the method offers also the possibility of coarse or fine step calibration as a function of frequency: taking as an example, the above discussed tuner, covering 1.8-18 GHz, can be calibrated at 1.8 GHz using a horizontal increment of 24 µm/step (motor 51 stands still) or, at 18 GHz, using a horizontal increment of 6 µm (instead of one motor 50 step, motor 51 executes 1 to 3 additional steps, as discussed before). This can be decided dynamically, during an automated frequency by frequency calibration to cover multiple frequencies, based on actual accuracy data of the applied interpolation. In any case there will be a significant benefit in calibration time without sacrifice of tuning resolution.

Figure 7:
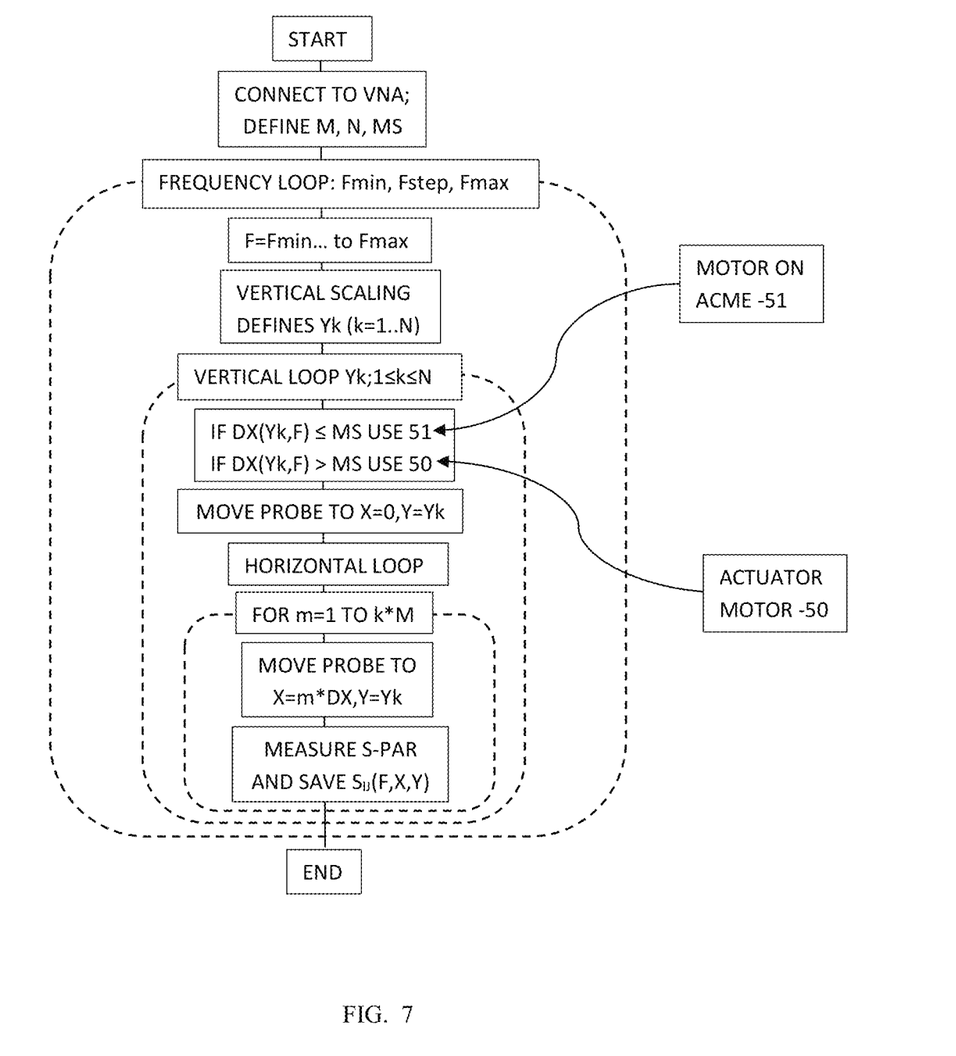
FIG. 7 depicts the flowchart of frequency dependent tuner calibration using the adjustable PITCH concept.

A dynamic calibration (FIG. 7) takes care of optimizing addressable tuning points (phase tuning resolution) versus speed. The objective of the calibration is to cover the Smith chart with equally spread calibration (anchor) points allowing accurate subsequent interpolation between them. Point density is defined by the number of tunable positions (reflection factors) in the free area (segment) between calibration anchor points (area defined by anchor points [X1,Y1] to [X3,Y3] in FIG. 8). In radial direction (Y1, Y2, Y3) the height of the trapezoidal segment between the closest calibration points is defined by the number of constant circles (N) in the calibration. The length of the top and bottom arc of the segment [X1,Y3] to [X3,Y3] are proportional to the phase increment times the radius ($|S_{11}(Y3)|$). To keep the surface of the segments (and the validity of the interpolation, which uses the calibration points as anchors) roughly constant, one has to select carefully the horizontal increment size DX (in motor steps) as a function of frequency and radius ($|S_{11}|$) to allow for high phase resolution at the highest frequency of operation and posterior accurate interpolation (see ref. 3).

Figure 9A:
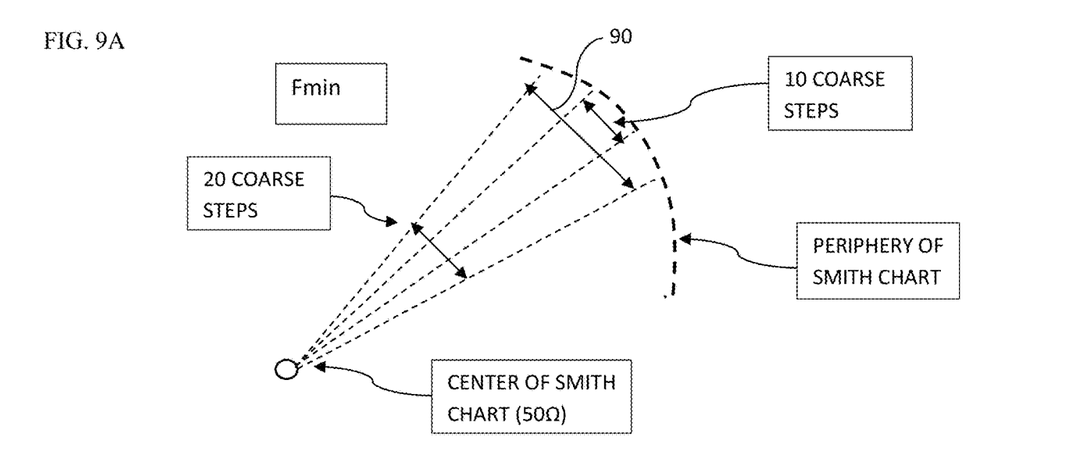
Figure 9B:
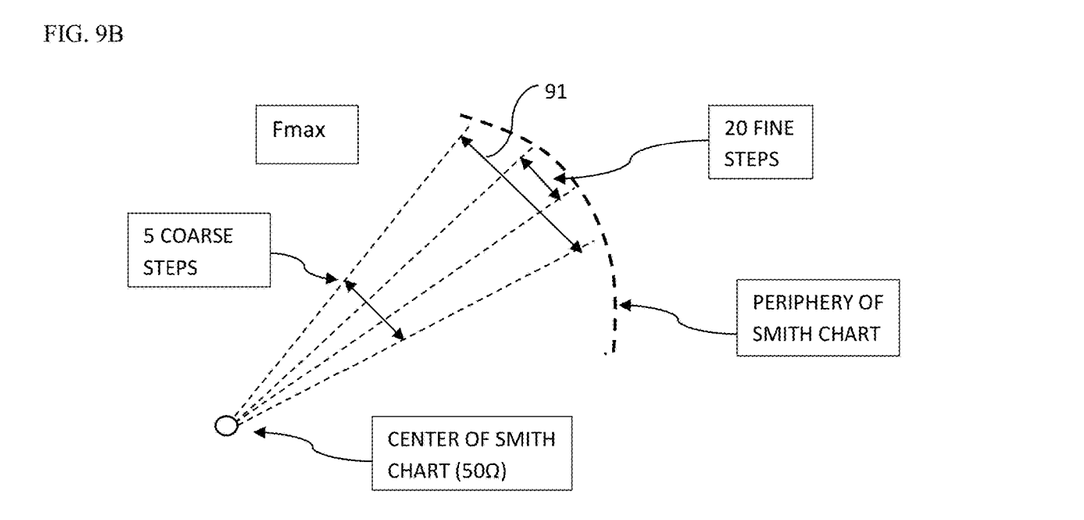

The calibration step Xk at reflection circle k includes a number of coarse motor 50 steps (XC) and a number of fine motor 51 steps (XF): Xk=A*XC+B*XF; the numbers A and B must be calculated for each radius $|S_{11}|$ and frequency F. As the number of points on a calibration circle increases linearly with the radius $|S_{11}|$ (or the equivalent index k) the length of the arc segment increases for the same angle (FIG. 9), therefore we need more calibration points at higher radius. This is done by increasing the number of horizontal anchor points AP proportional to the radius, AP=k*M, wherein k is the index of the circle 1≤k≤N and M is a (user defined) calibration point density factor determining how many calibration anchor points will be included on each constant $|S_{11}|$ circle. Determination of the vertical probe position uses the prior art scaling routine (see ref. 3, FIG. 12 and column 5, lines 1-16). As can be seen from FIG. 9A and 9B the number of motor (coarse or fine) steps at medium to large $|S_{11}|$ is different as a function of frequency (items 90 and 91). The required horizontal travel is always fixed at λ/2, which varies inverse proportional to the frequency F. At low $|S_{11}|$ the acceptable spread of calibration points requires less horizontal anchoring points. This means the given horizontal travel Xmax=λ/2 is divided into less calibration anchor stops (Xk=Xmax/(k*M)) wherein k=1,2,3. A coarse step size, using only motor 50, can be used. At high $|S_{11}|$ the length Xmax is divided in more calibration anchor stops (Xk=Xmax/(k*M)) wherein k=7,8,9. This means the number of steps between stops is smaller, or can even reach less than 1, if coarse motor 50 steps XC are used. Therefore, fine motor 51 steps XF will be required. At higher frequencies, where Xmax=λ/2 is smaller the situation is even more pronounced. In this case it may be required to only use fine motor 51 steps XF in the whole Smith chart area.

Figure 8:
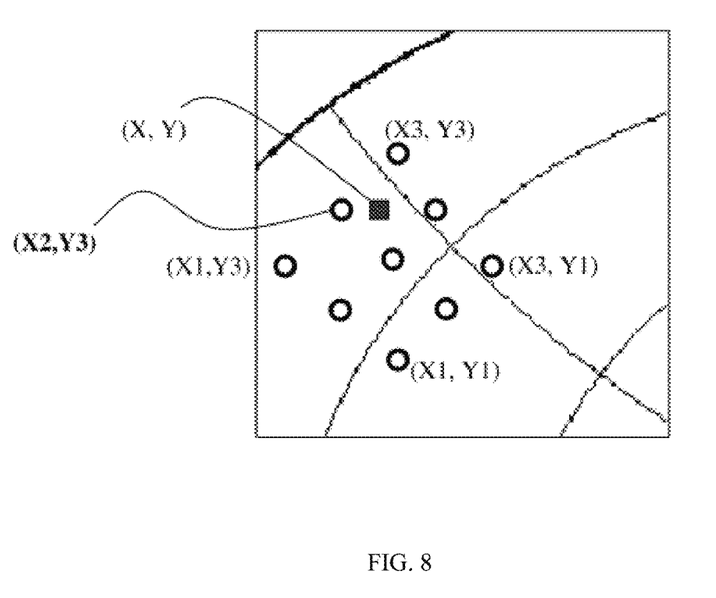
FIG. 8 depicts prior art, calibration anchor points and tuning.

What is not immediately obvious from FIG. 8 is the included motor steps, i.e. the addressable probe positions, between calibration anchor points [X1,Y1] to [X3,Y3]. Assume the mechanically fixed PITCH is 12 and there will be 10 controllable positions between X2 and X3, where the target X (in FIG. 8) is located; if the effective PITCH is increased by a factor of 4 from 12 to 48, then there will be 40 controllable positions between X2 and X3. That is, we can increase the tuning resolution without changing the anchoring calibration points of FIG. 8 or the tuning theory disclosed in ref. 3, column 5, lines 62-63.

The calibration proceeds as follows: Each concentric circle k (1≤k≤N) is divided in k*M equal arc segments. Each circle requires approximately λ/2 horizontal probe movement, i.e. each arc segment is λ(2*k*M) long and includes at least Xk motor steps: if the number Xk=λ/(2*k*M)/XC of coarse (XC) motor steps is larger than a number MS (motor steps) then the calibration of the specific circle k proceeds using coarse XC (motor 50) steps. If Xk is smaller than MS then the calibration of the specific circle k proceeds using fine XF (motor 51) steps (refer to FIG. 5).

Proper calculation of Xk requires an experience-based threshold MS of motor steps for each arc segment to be covered for each reflection factor level $|S_{11}|$, or concentric circle k, on the Smith chart (see ref. 3 FIG. 8). We typically assume this threshold MS to be equal to 10; We know by previous mechanical measurements the size of fine (XF) and coarse (XC) steps (with XC/XF=R2/R1, see FIG. 4). The horizontal travel length L creating the above defined arc segment, which corresponds to the horizontal distance between calibration stops, can be defined as L=A(k)*XC+B(k)*XF=λ(2*k*M); if A(k)≥MS we use coarse actuator motor 50 (XC) steps. If not, we use fine XF motor 51 steps or a combination thereof.

This method accelerates calibration without sacrificing tuning resolution. In order to move the probe fast, every horizontal travel length L can be split into a number A(k) of coarse steps XC to be executed first, and a number B(k) of fine steps XF to be executed second for a combined total of L=A(coarse steps)+B(fine steps), which is faster than (A*R2/R1+B) (fine steps). Using the length L and steps XC and XF it can be calculated: A=(int)(L/XC) and B=(int)(L−A*XC)/XF, wherein (int) is the module of a real number, i.e. (int)5.6=5, (int)(−2.3)=−2.

The slide screw tuner with numerically adjustable horizontal step control (PITCH) has been disclosed using a preferred embodiment. Obvious alternatives, though imaginable, shall not impede on the validity of the present invention.

What is claimed is:
1. A slide screw impedance tuner having mechanically adjustable horizontal movement step resolution, comprising:
 a low loss slotted airline having a test port, an idle port, and a center conductor between the ports;
 a rotatable lead screw extending horizontally along a length of the slotted airline;
 at least one mobile carriage horizontally translatable on the lead screw along the slotted airline on a horizontal axis,
 said at least one mobile carriage comprising:
  a first stepper motor;
  a metallic tuning probe insertable into a slot of the airline along a vertical axis perpendicular to the horizontal axis between a withdrawal position Y=0 and a maximum penetration position Y=YMAX, a position of the metallic tuning probe between the withdraw al position and the maximum penetration position controllable by the first stepper motor;
  a motorized linear stepper actuator having a rotor threadingly engaged with the lead screw, the linear stepper actuator controllable to rotate the rotor relative to the lead screw to provide a per actuator-motor-step coarse displacement XC for controlling a horizontal position of the mobile carriage along the slotted airline on the horizontal axis; and a second stepper motor, controllable independently from the linear stepper actuator, to rotate the lead screw relative to the rotor of the linear stepper actuator to provide a per actuator-motor-step fine displacement XF for controlling a horizontal position of the mobile carriage along the slotted airline on the horizontal axis.

2. The slide screw impedance tuner of claim 1, further comprising:
a first pulley P1 having a diameter D1 attached to the second stepper motor;
a second pulley P2 having a diameter D2 attached to the lead screw; and
a timing belt rotatably linking the first pulley P1 with the second pulley P2;
wherein a first rotation of the first pulley P1 by the second stepper motor causes a corresponding second rotation of the second pulley P2 and the lead screw.

3. The slide screw impedance tuner of claim 2, wherein diameters D1 and D2 of the pulleys P1 and P2 are chosen such that the per actuator-motor-step fine displacement at a maximum frequency of operation of the slide screw impedance tuner is equal to XF=XC*D1/D2.

4. A method of moving the metallic tuning probe of the slide screw impedance tuner of claim 3 from a position X1, Y1 to a position X2 Y2, the method comprising:
determining a number A of coarse displacements XC and a number B of fine displacements XF for moving the metallic tuning probe a horizontal travel distance of $\Delta X = X2-X1$, wherein $A=(int)(\Delta X/XC)$ and $B=(int)((\Delta X-A*XC)/XF)$;
moving the linear stepper actuator A steps;
moving the second stepper motor B steps; and
moving the metallic tuning probe to position Y2.

* * * * *